United States Patent
Yu et al.

(10) Patent No.: US 8,308,495 B2
(45) Date of Patent: Nov. 13, 2012

(54) PUSH-PUSH CARD CONNECTOR

(75) Inventors: Jian-Fei Yu, Kunshan (CN); Feng Zhou, Kunshan (CN); Qi-Jun Zhao, Kunshan (CN)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 13/050,924

(22) Filed: Mar. 17, 2011

(65) Prior Publication Data
US 2011/0230072 A1    Sep. 22, 2011

(30) Foreign Application Priority Data

Mar. 18, 2010  (CN) .......................... 2010 2 0133762

(51) Int. Cl.
H01R 13/62    (2006.01)
(52) U.S. Cl. ...................................... 439/159
(58) Field of Classification Search .................. 439/159, 439/160, 152, 155, 337, 946, 157
See application file for complete search history.

(56) References Cited

U.S. PATENT DOCUMENTS

| 6,875,033 | B2* | 4/2005 | Sato et al. ...................... 439/159 |
| 7,575,452 | B2* | 8/2009 | Chikashige et al. .......... 439/159 |
| 2009/0246993 | A1 | 10/2009 | Yu | |

* cited by examiner

Primary Examiner — Alexander Gilman
(74) Attorney, Agent, or Firm — Wei Te Chung; Ming Chieh Chang

(57) ABSTRACT

A card connector (100) comprises an insulative housing (1), a plurality of contacts (2) retained in the insulative housing (1) and an ejecting mechanism (4). The insulative housing (1) defines an interface (14) in front and a receiving space (10) extending backwardly from the interface (14). The ejecting mechanism (4) comprises a slider (41), a spring (42) sandwiched between the slider (41) and the insulative housing (1), and a pole (43) for controlling the slider (41). The slider (41) defines a heart-shape groove (414) and a heart-shape block (415) located in the heart-shape groove (414). The heart-shape groove (414) includes a first slot (4141). The heart-shape block (415) includes a mucro (4154) at a rear end thereof. The mucro (4154) and the first slot (4141) define an escaping space (4153) therebetween. When the pole (43) moves aslant, the escaping space (4153) will receive the pole (43) for avoiding the pole (43) colliding with the mucro (4153).

18 Claims, 6 Drawing Sheets

PUSH-PUSH CARD CONNECTOR

BACKGROUND OF THE INVENTION

1. Field of the Invention

The present invention relates to a card connector for preventing an electrical card from being locked in the card connector by mistake.

2. Description of Related Art

Small electrical cards with a large memory are used in many kinds of portable electrical products, such as digital cameras, PDAs, mobile phones etc. The electrical product usually has a circuit board with a card connector mounted thereon for electrically connecting the electrical card.

US. Publication 20090246993 A1 disclosed a card connector including an insulative housing with a plurality of contacts retained therein, an ejecting mechanism mounted on the insulative housing and a metal shell covering the insulative housing. The metal shell and the insulative housing define a receiving space for receiving an electrical card. The ejecting mechanism includes a slider mounted on the insulative housing, a spring sandwiched between the slider and the insulative housing and a pole fixed between the insulative housing and the slider. The slider can move along a front-to-back direction to bring the electrical card in or out of the card connector. The slider includes a heart-shape groove and a heart-shape block located in the middle of the heart-shape groove. The heart-shape block defines a mucro at a rear end thereof.

While the electrical card is inserted into the receiving space of the card connector, the pole may move aslant easily, so the pole may catch the mucro and can not move forwardly again. So the slider will be stopped at a mistake position. Thus the electrical card would be locked in the card connector by mistake.

Hence, an improved card connector is desired to solve the problem above.

BRIEF SUMMARY OF THE INVENTION

According to one aspect of the present invention, a card connector for connecting an electrical card, comprises an insulative housing, a plurality of contacts retained in the insulative housing and an ejecting mechanism. The insulative housing defines an interface in front, a receiving space extending backwardly from the interface for receiving the electrical card and a bottom wall located under the receiving space. The contacts protrude into the receiving space. The bottom wall has a sliding face thereof. The ejecting mechanism comprises a slider moving along a front-to-back direction, a spring sandwiched between the slider and a rear end of the insulative housing, and a pole for controlling the slider to be positioned at a first position or a second position. The first position is farther away from the interface than the second position. The slider defines a heart-shape groove and a heart-shape block located in the heart-shape groove. The heart-shape groove includes a first slot located at one side of the heart-shape block. The heart-shape block includes a mucro and an escaping space defined between the mucro and the first slot. When the pole moves aslant, the escaping space will receive the pole for avoiding the pole colliding with the mucro.

According to another aspect of the present invention, a card connector comprises an insulative housing, a plurality of contacts disposed in the insulative housing and an ejecting mechanism. The insulative housing cooperates with a shell to commonly define a receiving space therebetween in a vertical direction for receiving an electrical card. Contacting portions of the contacts extend into the receiving space. The ejecting mechanism is located beside the receiving space. The ejecting mechanism comprises a slider for moving along with the electrical card, a spring constantly urging the slider forwardly and a pole. The slider is moveable relative to the insulative housing along a front-to-back direction. The slider defines a heart-shape groove and a heart-shape block located in the heart-shape groove. The pole defines a moveable end moving along the heart-shaped groove during back and fourth movement of the slider in the front-to-back direction. The heart-shape groove includes a first slot for guiding the pole to move in the heart-shaped groove. The heart-shape block defines an upper surface, a first side wall and a second side wall. The first and second side walls extend downwardly from the upper surface. The first and second side walls from a mucro. An escaping space is defined between the first side wall and the first slot. The pole is received in the escaping space when the pole moves aslant, so as to avoid the pole colliding with the mucro.

Other objects, advantages and novel features of the present invention will become more apparent from the following detailed description of the present embodiment when taken in conjunction with the accompanying drawings.

DETAILED DESCRIPTION OF THE PREFERRED EMBODIMENTS

Figure 1:
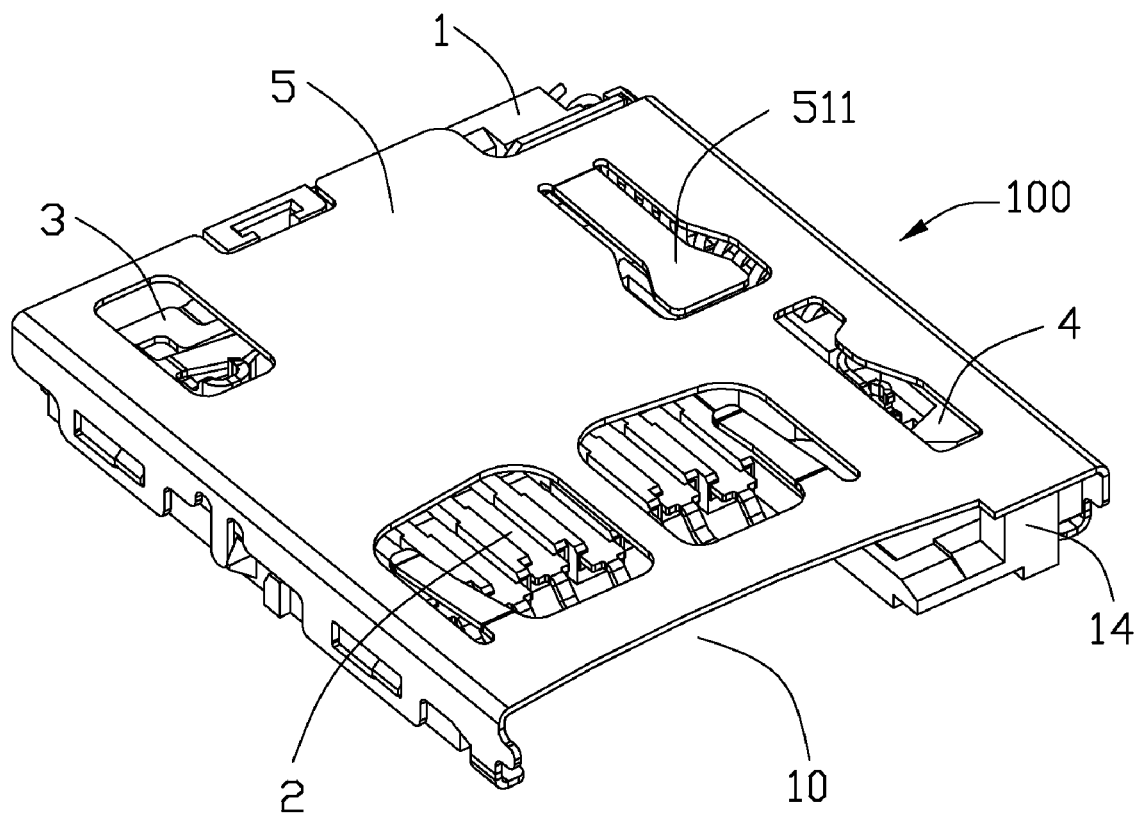
FIG. 1 is a perspective view of a card connector.
Figure 2:
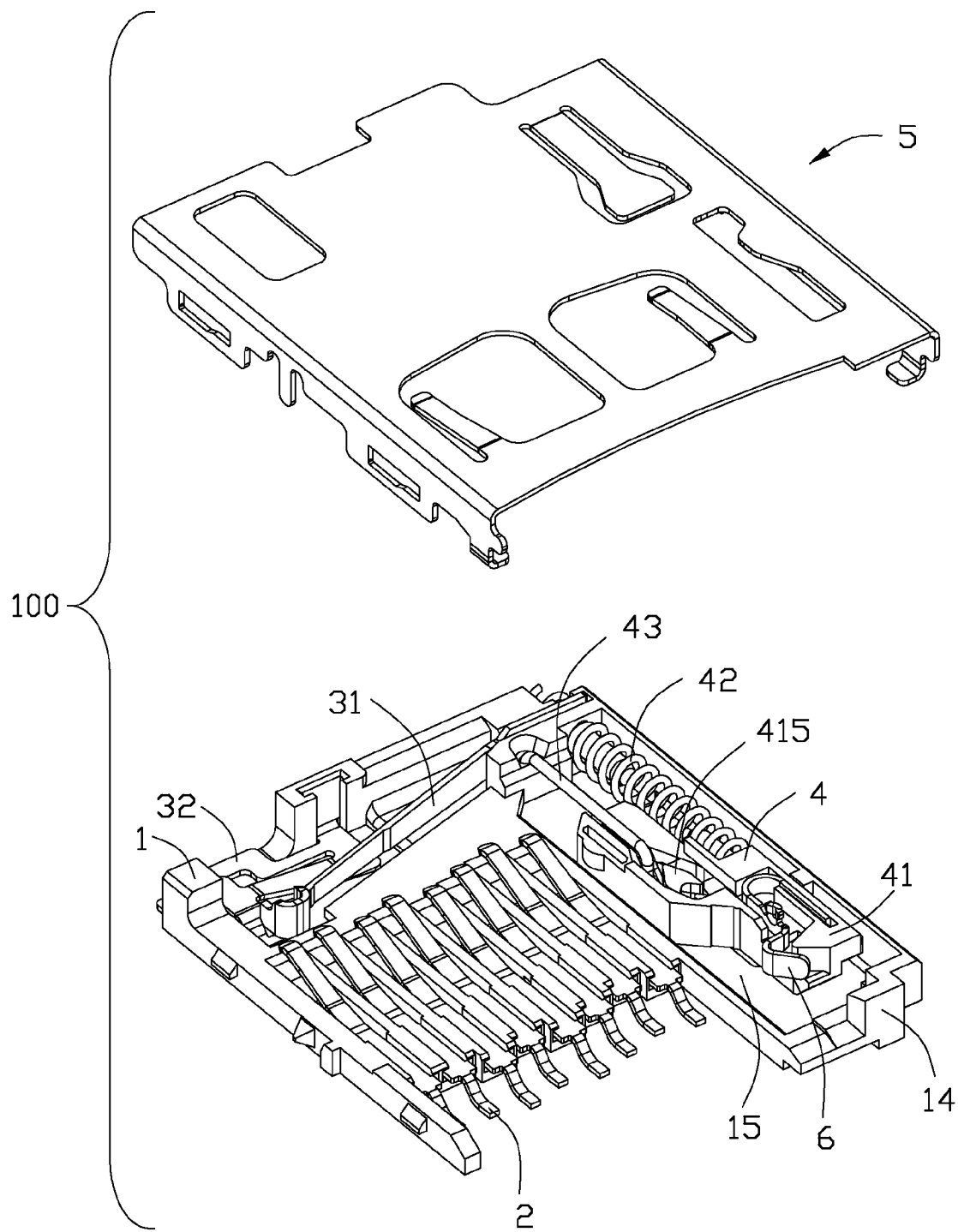
FIG. 2 is a partly exploded view of the card connector shown in FIG. 1.

Reference will be made to the drawing figures to describe the present invention in detail, wherein depicted elements are not necessarily shown to scale and wherein like or similar elements are designated by same or similar reference numeral through the several views and same or similar terminology.

Referring to FIGS. 1-6, a card connector 100 for receiving an electrical card (not shown), comprises an insulative housing 1, a plurality of contacts 2 retained in the insulative housing 1, a switch 3 installed on a rear end of the insulative housing 1, a push-push type ejecting mechanism 4 fixed in the insulative housing 1, a metal shell 5 covering the insulative housing 1 and a spring portion 6 retained on the ejecting mechanism 4 for locking the electrical card.

Figure 3:
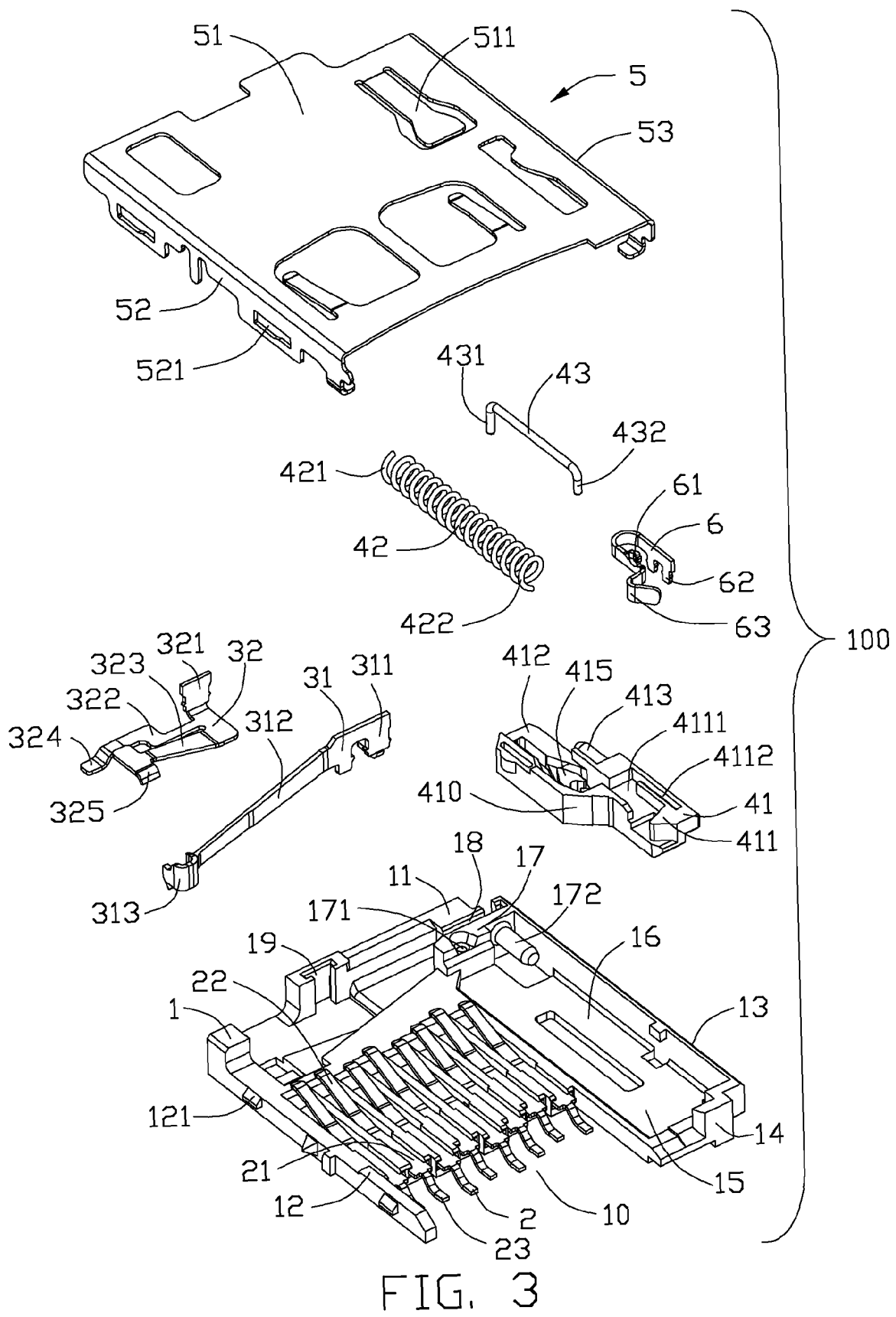
FIG. 3 is an exploded view of the card connector shown in FIG. 1.
Figure 4:
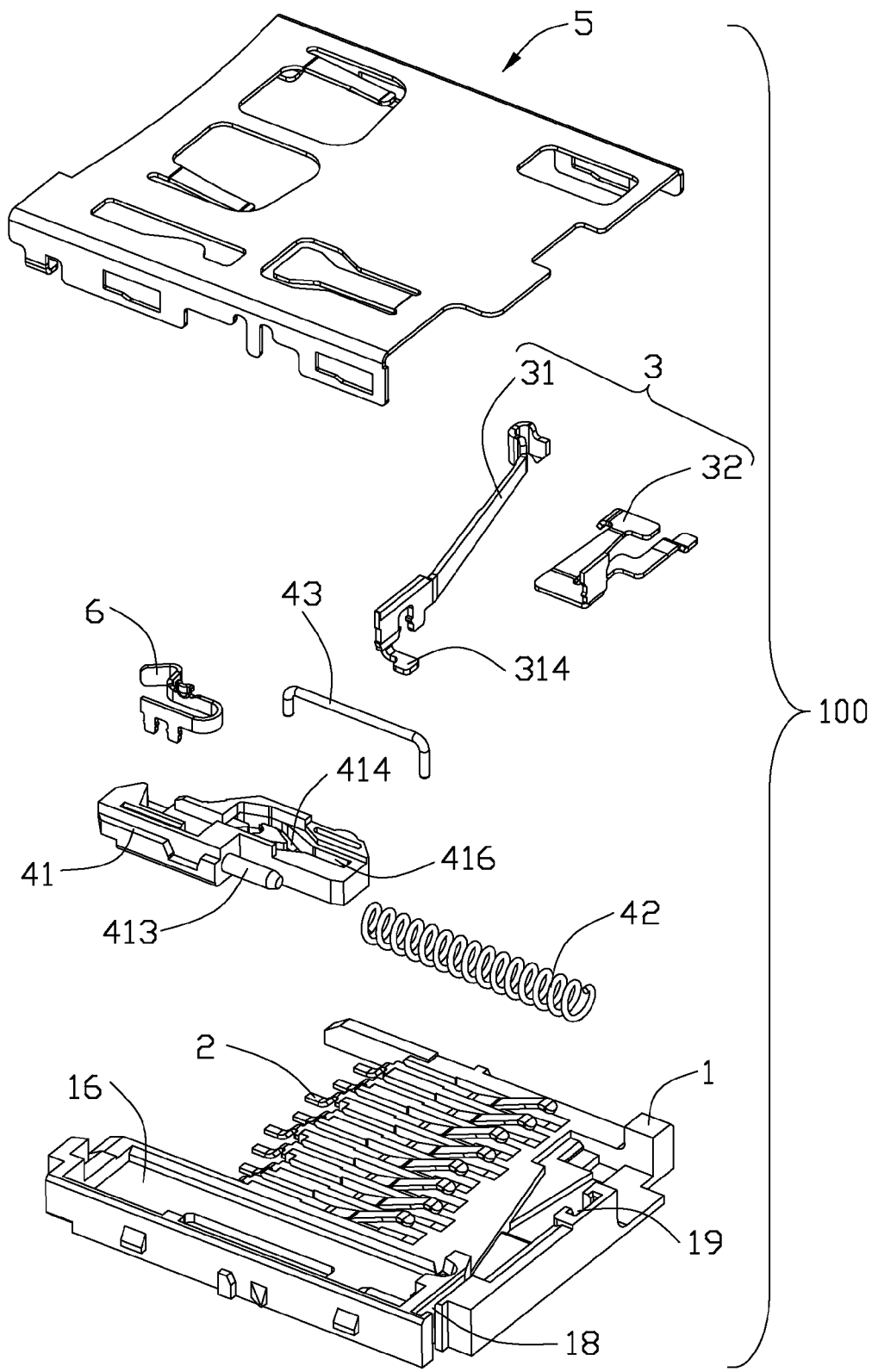
FIG. 4 is similar to FIG. 3, but viewed from another aspect.

Referring to FIGS. 3-4, the insulative housing 1 has a rear wall 11, a bottom wall 15, an interface 14 in front, a receiving space 10 extending backwardly from the interface 14 along a front-to-back direction for receiving the electrical card and two opposite side walls extending upwardly from two lateral sides of the bottom wall 15. The side walls include a first side wall 12 and a second side wall 13. The first and second side walls 12, 13 define a plurality of protuberances 121 for engaging with the metal shell 5. The contacts 2 are installed on the bottom wall 15. The bottom wall 15 is located under the receiving space 10 and defines a sliding face 16. The insulative housing 1 includes an installing portion 17, a first groove 18 and a second groove 19. The installing portion 17 is located between the sliding face 16 and the rear wall 11. The switch 3 is fixed in the first and second grooves 17, 18. The installing portion 17 includes an installing hole 171 and a first protrusion 172.

Referring to FIGS. 3-4, the contacts 2 are retained in the insulative housing 1 for mating with the electrical card. The contacts 2 are arranged on the insulative housing 1 along a transverse direction. Each contact 2 includes a securing portion 21 retained on the bottom wall 15, a contacting portion 22 protruding from the securing portion 21 into the receiving space 10 for connecting with the electrical card and a soldering portion 23 extending from the securing portion 21 out of the insulative housing 1.

Referring to FIG. 3, the switch 3 includes a first switch 31 and a second switch 32 which can abut against the first switch 31. The second switch 32 is positioned at a position farther away from the receiving space 10 than the first switch 31 along the front-to-back direction. The first switch 31 includes a first fixing portion 311 retained in the first groove 18, a first extending portion 312 extending aslant along a left-to-right direction, a first engaging portion 313 extending from the first extending portion 312 and a first soldering portion 314 extending backwardly from the first fixing portion 311.

Referring to FIG. 3, the second switch 32 includes a second fixing portion 321 retained in the second groove 19, a second extending portion 322 extending along the left-to-right direction, a third extending portion 323 extending from the second fixing portion 321, a second soldering portion 324 extending from the second extending portion 322 and a second engaging portion 325 extending from the third extending portion 323. The third extending portion 323 is located at the front of the second extending portion 322. The second engaging portion 325 abuts against the first engaging portion 313 when the electrical card is inserted into the receiving space 10.

Referring to FIG. 3, the push-push type ejecting mechanism 4 is disposed on the sliding face 16 of the insulative housing 1. The ejecting mechanism 4 comprises a slider 41 moveably received in the insulative housing 1 and moving along the front-to-back direction, a coiled spring 42 sandwiched between the slider 41 and a rear end of the insulative housing 1 and a pole 43 for controlling positions of the slider 41. The spring 42 can urge the slider 41 forwardly. The spring 42 has a front end for engaging with the slider 41 and a rear end for abutting against the insulative housing 1. The spring portion 6 is secured in the slider 41. The pole 43 is used for controlling the slider 41 to be positioned at a first position or a second position. The first position is farther away from the interface 14 than the second position. The first position is a beginning position of the slider 41 before the electrical card being inserted into the card connector 100. The second position is a final position of the slider 41 with the contacts 2 electrically connecting with the electrical card.

Figure 5:
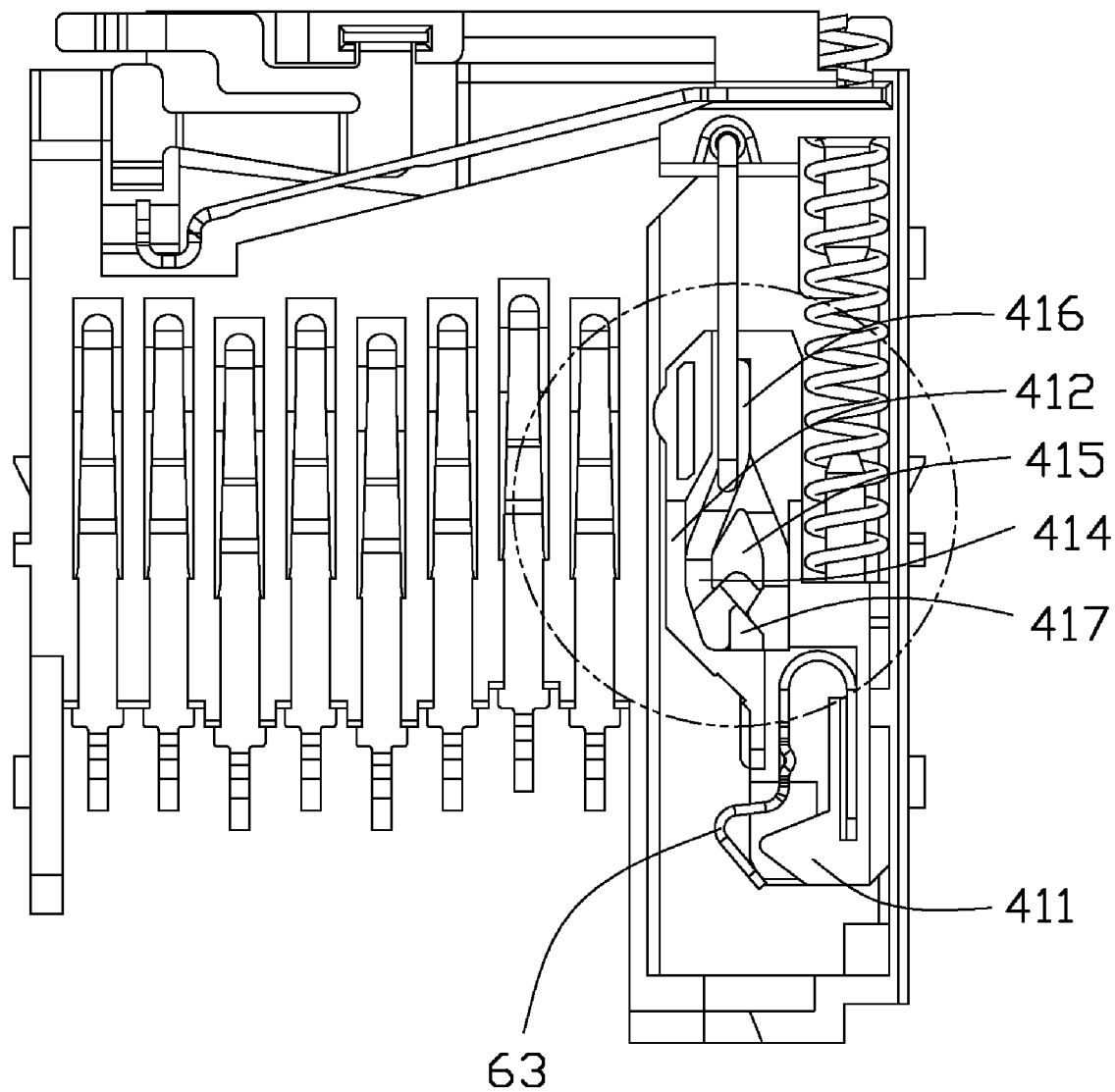
FIG. 5 is a bottom view of the card connector shown in FIG. 1 without a shell.

Referring to FIGS. 3-5, the slider 41 includes a first body portion 411 extending along the front-to-back direction, a second body portion 412 located at the back of the first body portion 411 and a second protrusion 413 extending backwardly for abutting against the front end of the spring 42. The first body portion 411 is located at an outer side and a front side of the second body portion 412. The first body portion 411 defines an installing groove 4111 for receiving the spring portion 6. The installing groove 4111 includes a fixing groove 4112 for fixing the spring portion 6.

Referring to FIGS. 3-4, the second body portion 412 includes an engaging face 410, a heart-shape groove 414 for guiding and limiting a movement of the slider 41, a heart-shape block 415 located in the middle of the heart-shape groove 414, a straight guiding groove 416 located at a rear end of the heart-shape groove 414 and a bulge 417 located at a front end of the heart-shape block 415. The straight guiding groove 416 is in connection with the heart-shape groove 414. The engaging face 410 abuts against a front end of the electrical card when the electrical card is inserted into the receiving space 10. The slider 41 slides backwardly along with the insertion force of the electrical card. The heart-shape block 416 presents an arc-shape frame in a front end thereof.

Figure 6:
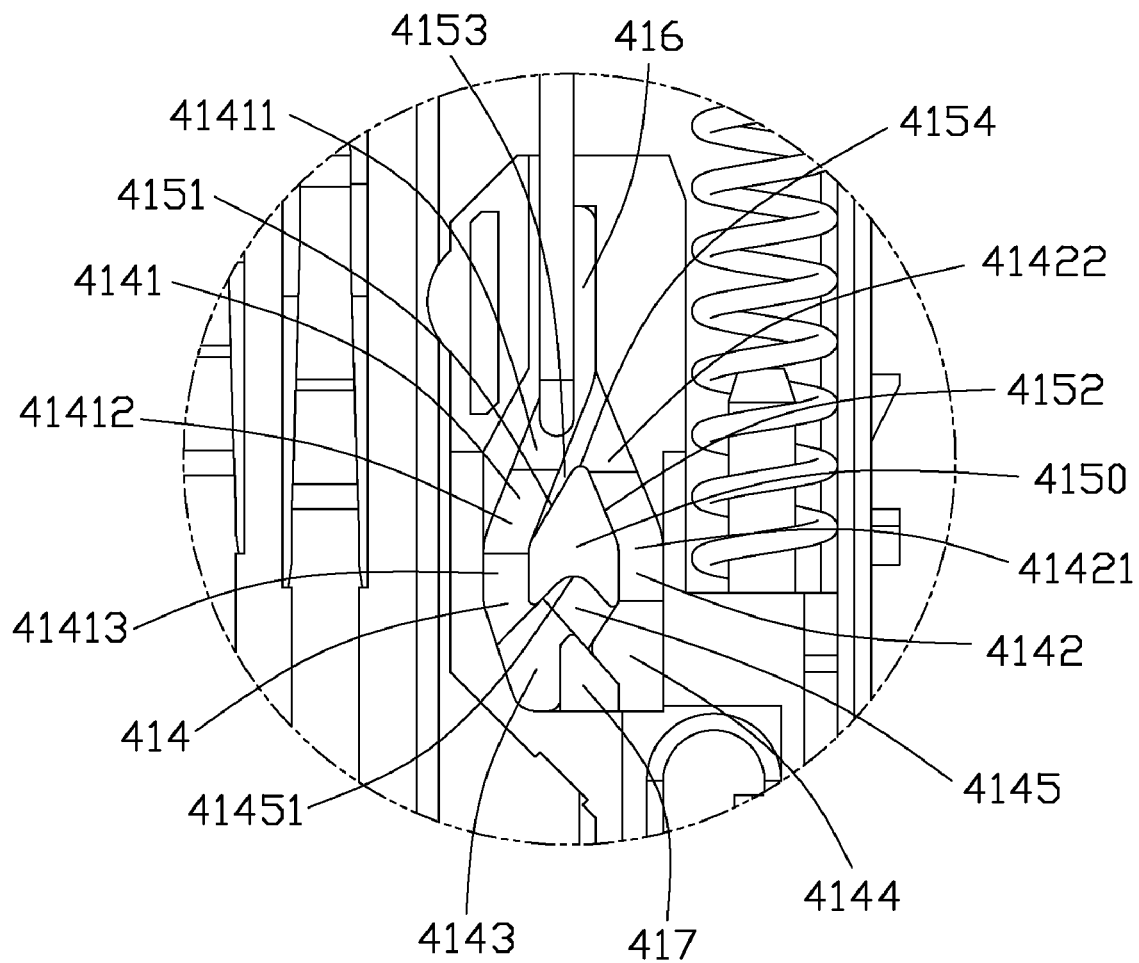
FIG. 6 is an enlarged view of the circled area in FIG. 5.

Referring to FIG. 6, The heart-shape groove 414 has a first slot 4141, a second slot 4142, a third slot 4143, a fourth slot 4144 and a locking slot 4145. The first and second slots 4141, 4142 connect with each other and are located at two sides of the heart-shape block 416 respectively. The third and fourth slots 4143, 4144 connect with each other and are located at two sides of the bulge 417 respectively. The first and third slots 4141, 4143 are located at a left side of the slider 41 for guiding the pole 43 to insert. The second and fourth slots 4142, 4144 are located at a right side of the slider 41 for guiding the pole 43 to withdraw. The first, second, third and fourth slots 4141, 4142, 4143, 4144 and the locking slot 4145 connect with each other and form the heart-shape groove 414. The first slot 4141 is longer than the third slot 4143 along the front-to-back direction. The second slot 4142 is longer than the fourth slot 4144 along the front-to-back direction. The locking slot 4145 presents as a concave. The concave defines a lower mucro 41451, a front end of the pole 43 and the lower mucro 41451 are in the same line.

Referring to FIG. 6, the heart-shape block 415 includes a mucro 4154 at a rear end thereof. The mucro 4154 and the first slot 4141 define an escaping space 4153 therebetween. When the pole 43 moves aslant, the escaping space 4153 will receive the pole 43 for avoiding the pole 43 colliding with the mucro 4154. The escaping space 4153 is formed on the heart-shape block 415 by removing an area of the heart-shape block 415. The area is adjacent to the mucro 4154. The mucro 4154 and the escaping space 4153 offset from each other along the transverse direction. The transverse direction is perpendicular to the inserting direction of the electronic card. Under this condition, the pole 43 will not catch a rear end of the heart-shape block 415 when the pole 43 moves tipsily, it will make the pole 43 move normally in the heart-shape groove 414, so the electrical card can be inserted into the receiving space 10 steadily.

A first plane located under the escaping space 4153 is higher than a second plane located under the first slot 4141. The pole 43 slides along the heart-shape groove 414 when the slider 41 is positioned from the first position to the second position. The escaping space 4153 is located at the front of the straight guiding groove 416. The first plane is higher than a third plane located under the straight guiding groove 416. The second plane presents as step. The escaping space 4153 defines an opening towards the second slot 4142.

The second plane includes a first segment 41411 connecting with the third plane, a second segment 41412 extending forwardly from the first segment 41411 and a third segment 41413 extending forwardly from the second segment 41412. The second segment 41412 is higher than the first segment 41411. The first segment 41411 is coplanar with the third plane. A first space is formed between the second segment 41412 and the first plane along an up-to-down direction. A second space is formed between the first segment 41411 and the first plane along the up-to-down direction. The first space is smaller than the second space.

A fourth plane located under the second slot 4142 includes a first part 41421 located at the back of the fourth slot 4144 and a second part 41422 located at the back of the first part 41421. The second part 41422 is in connection with the second and third planes. The first plane includes a front portion, a rear portion and a middle portion located between the front and rear portions. The front portion is coplanar with the second plane. The rear portion is higher than the second plane. The middle portion is gradually higher than the second plane along the front-to-back direction. The second part 41422 is coplanar with the first plane.

The heart-shape block 415 includes an upper surface 4150, a first side wall 4151 and a second side wall 4152. The first and second side walls 4151, 4152 extend downwardly from the upper surface 4150 and are located at two sides of the upper surface 4150 respectively. The first and second side walls 4151, 4152 form the mucro 4154 in a rear end thereof. The escaping space 4153 is disposed between the first slot 4141 and the first side wall 4151. The first plane is lower than the upper surface 4150. The mucro 4154 and a front end of the pole 43 offset from each other along the transverse direction. The upper surface 4150, the first side wall 4151 and the second side wall 4152 form a non-isosceles triangle. The first side wall 4151 is longer than the second side wall 4152.

Referring to FIGS. 3-4, the spring 42 includes a first portion 421 located in front and a second portion 422 located in the wings. The first portion 421 is disposed on the first protrusion 172 of the insulative housing 1. The second portion 422 engages with the second protrusion 413 of the slider 41.

Referring to FIGS. 3-4, the pole 43 includes a first part 431 located in the front and a second part 432 located in the wings. The first part 431 is installed in the installing hole 171 of the insulative housing 1. The second part 432 can move in the heart-shape groove 414 by the electrical card inserting into the receiving space 10.

Referring to FIG. 3, the metal shell 5 is made of a piece of metal sheet, and comprises a top wall 51, a first side portion 52 and a second side portion 53. The first and second side portions 52, 53 is bent downwardly from two lateral sides of the top wall 51. The top wall 51 has an flexible piece 511 for preventing the pole 43 from moving upwardly along the up-to-down direction. The first and second side portions 52, 53 include a plurality of through holes 521 for engaging with the protuberance 121 of the insulative housing 1.

Referring to FIG. 3, the spring portion 6 is secured in the installing groove 4111 of the slider 41. The spring portion 6 includes a U-shape body portion 61, a retaining portion 62 extending downwardly from one end of the body portion 61 and a locking portion 63 extending inwardly from another end of the retaining portion 61 for locking the electrical card. The electrical card has a cutout for receiving the locking portion 63.

The slider 41 is located at the first position before the electrical card is inserted into the receiving space 10. When the electrical card is inserted into the receiving space 10 normally, one side of the electrical card resists the locking portion 63 outwardly, then when the electrical card continues moving, the locking portion 63 will lock into the cutout of the electrical card. The front end of the electrical card pushes the slider 41 to move backwardly along the front-to-back direction. The pole 43 moves in the heart-shape groove 414. When the pole 43 moves tipsily, the pole 43 will not catch the mucro 4154 of the heart-shape block 415 and gets across the heart-shape block 415 because of the escaping space 4153. So the electrical card can be inserted into the receiving space 10 steadily. When the electrical card is pushed backwardly to the second position, the contacts 2 electrically connect with the electrical card.

Referring to FIG. 5, during withdrawing the electrical card, an operator would push the electrical card forwardly, the electrical card is ejected by the ejecting mechanism 4, the slider 41 drives the electrical card moving fast from the second position to the first position.

It is to be understood, however, that even though numerous characteristics and advantages of the present invention have been set fourth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed. For example, the tongue portion is extended in its length or is arranged on a reverse side thereof opposite to the supporting side with other contacts but still holding the contacts with an arrangement indicated by the broad general meaning of the terms in which the appended claims are expressed.

What is claimed is:

1. A card connector for connecting an electrical card, comprising:
  an insulative housing defining an interface in the front and a receiving space extending backwardly from the interface for receiving the electrical card and a bottom wall located under the receiving space, the bottom wall having a sliding face thereof;
  a plurality of contacts retained in the insulative housing and protruding into the receiving space; and
  an ejecting mechanism comprising a slider moving along a front-to-back direction, a spring sandwiched between the slider and a rear end of the insulative housing, and a pole for controlling the slider to be positioned at a first position or a second position, the first position being farther away from the interface than the second position, the slider defining a heart-shape groove and a heart-shape block located in the heart-shape groove, the heart-shape groove including a first slot located at one side of the heart-shape block;
  wherein the heart-shape block includes a mucro and an escaping space defined between the mucro and the first slot, when the pole moves aslant, the escaping space will receive the pole and preventing the pole from colliding with the mucro, wherein
  a first plane located under the escaping space is higher than a second plane located under the first slot.

2. The card connector as claimed in claim 1, wherein the escaping space is formed on the heart-shape block by removing an area of the heart-shape block, the area is adjacent to the mucro, the mucro and the escaping space offset from each other along a transverse direction perpendicular to the inserting direction.

3. The card connector as claimed in claim 1, wherein the slider includes a straight guiding groove located at a rear end of the heart-shape groove, the pole slides along the straight guiding groove when the slider is positioned from the first position to the second position, the escaping space is located at a front end of the straight guiding groove, the first plane is higher than a third plane located under the straight guiding groove.

4. The card connector as claimed in claim 3, wherein the second plane presents as a step, the second plane includes a first segment connecting with the third plane and a second segment extending forwardly from the first segment, the second segment is higher than the first segment, the first segment is coplanar with the third plane.

5. The card connector as claimed in claim 4, wherein a first space is formed between the second segment and the first plane along an up-to-down direction, a second space is formed between the first segment and the first plane along the up-to-down direction, the first space is smaller than the second space.

6. The card connector as claimed in claim 1, wherein the first plane includes a front portion, a rear portion and a middle portion located between the front and rear portions, the front portion is coplanar with the second plane, the rear portion is higher than the second plane, the middle portion is gradually higher than the second plane along the front-to-back direction.

7. The card connector as claimed in claim 1, wherein the heart-shape block defines an upper surface, a first side wall and a second side wall, the first and second side walls extend downwardly from the upper surface and are located at two sides of the upper surface respectively, the first and second side walls form the mucro in a rear end thereof, the escaping space is disposed between the first slot and the first side wall.

8. The card connector as claimed in claim 1, wherein the heart-shape groove has a third slot for guiding the pole inserting thereinto, a second and fourth slots for guiding the pole withdrawing and a locking slot, the first, second, third and fourth slots and the locking slot connect with each other and form the heart-shape groove, the locking slot presents as a concave, the concave defines a lower mucro, a front end of the pole and the lower mucro are in the same line.

9. A card connector comprising:
an insulative housing cooperating with a shell to commonly define a receiving space therebetween in a vertical direction for receiving an electrical card;
a plurality of contacts disposed in the insulative housing with contacting portion extending into the receiving space; and
an ejecting mechanism disposed in the insulative housing and located beside the receiving space,
said ejecting mechanism comprising
a slider for moving along with the electrical card, said slider being moveable relative to the housing along a front-to-back direction, the slider defining a heart-shape groove and a heart-shape block located in the heart-shape groove;
a spring constantly urging said slider forwardly; and
a pole defining a moveable end moving along the heart-shape groove during the movement of the slider in said front-to-back direction;
wherein the heart-shape groove including a first slot for guiding the pole to move in the heart-shape groove, the heart-shape block defines an upper surface, a first sidewall and a second sidewall, the first and second sidewalls extend in a vertical direction, the heart-shape block is formed with a mucro jointing the first and the second sidewalls, an escaping space is defined between the first sidewall and the first slot, the pole is received in the escaping space when the pole moves aslant, so as to avoid the pole colliding with the mucro, wherein
the escaping space is formed on the heart-shape block by removing an area of the heart-shape block, the area is adjacent to the mucro, the mucro and the escaping space offset from each other along a transverse direction, the transverse direction is perpendicular to the inserting direction of the electrical card.

10. The card connector as claimed in claim 9, wherein a first plane located under the escaping space is higher than a second plane located under the first slot.

11. The card connector as claimed in claim 10, wherein the second plane presents as a step, the second plane includes a first segment and a second segment extending forwardly from the first segment, the second segment is higher than the first segment, a first space is formed between the second segment and the first plane along an up-to-down direction, a second space is formed between the first segment and the first plane along the up-to-down direction, the first space is smaller than the second space.

12. A card connector for use with an electronic card, comprising:
a retaining body defining a card receiving space;
a plurality of contacts disposed in the body with contacting sections exposed in the card receiving space;
an ejecting mechanism disposed by one side of the card receiving space and including a slider moveable forth and back along a front-to-back direction, a spring located between the body and the slider to constantly urge the slider to move forwardly, a heart-shaped groove structure enclosing a heart-shaped block and commonly located on one of the slider and the body under condition that the heart-shaped groove defines an insertion path by one side of the heart-shaped block and a withdrawal path by the other side of the heart-shaped block, and a pole having one end connected to the other of the slider and the body and the other end moving along the heart-shaped groove for control the slider; wherein
the heart-shaped block defines a mucro region at a lower part thereof, and an escape space is formed by one side of said mucro region and confronting and further joined with the insertion path so as to tolerate tilting of the pole during insertion of the card.

13. The card connector as claimed in claim 12, wherein the heart-shaped groove is formed in the slider, and the end of the pole is secured to the body.

14. The card connector as claimed in claim 12, wherein the spring and the heart-shaped groove are essentially side by side arranged each other in a transverse direction perpendicular to the front-to-back direction.

15. The card connector as claimed in claim 12, wherein said retaining body includes at least an insulative housing.

16. The card connector as claimed in claim 15, wherein said retaining body further includes a metallic shell assumed to the insulaitve housing and covering the card receiving space in a vertical direction perpendicular to said front-to-back direction.

17. The card connector as claimed in claim 12, wherein a bottom of the escape space is higher than a bottom of the insertion path.

18. The card connector as claimed in claim 12, wherein the escaping space is formed on the heart-shape block by removing an area of the heart-shape block, the area being adjacent to the mucro, the mucro and the escaping space being offset from each other along a transverse direction, the transverse direction is perpendicular to the front-to-back direction of the electrical card.

\* \* \* \* \*